United States Patent
Watabe et al.

(10) Patent No.: US 6,741,651 B1
(45) Date of Patent: May 25, 2004

(54) VARIABLE-LENGTH ENCODER

(75) Inventors: Akihiro Watabe, Nara (JP); Eiji Miyagoshi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/600,573

(22) PCT Filed: Jan. 20, 1999

(86) PCT No.: PCT/JP99/00201

§ 371 (c)(1),
(2), (4) Date: Jul. 19, 2000

(87) PCT Pub. No.: WO99/38262

PCT Pub. Date: Jul. 29, 1999

(30) Foreign Application Priority Data

Jan. 21, 1998 (JP) .......................................... 10-009878

(51) Int. Cl.⁷ ............................. H04N 7/12; G06K 9/36
(52) U.S. Cl. ................ 375/240.23; 382/246; 348/419.1
(58) Field of Search ....................... 375/240.23, 240.13, 375/240.16, 240.22, 240.24, 240.14; 341/67; 382/243, 246; 386/111; 348/419.1

(56) References Cited

U.S. PATENT DOCUMENTS

| | | | |
|---|---|---|---|
| 5,319,457 A | | 6/1994 | Nakahashi et al. |
| 5,440,344 A | | 8/1995 | Asamura et al. |
| 5,668,598 A | | 9/1997 | Linzer et al. |
| 5,701,160 A | * | 12/1997 | Kimura et al. .......... 375/240.14 |
| 5,790,745 A | * | 8/1998 | Sugiyama et al. .......... 386/111 |
| 5,821,887 A | * | 10/1998 | Zhu .............................. 341/67 |
| 5,822,541 A | | 10/1998 | Nonomura et al. |
| 5,959,672 A | * | 9/1999 | Sasaki .................... 375/240.23 |
| 6,483,947 B1 | * | 11/2002 | Yasue et al. ................. 382/246 |
| 6,501,801 B2 | * | 12/2002 | Chujoh et al. ......... 375/240.23 |
| RE38,227 E | * | 8/2003 | Sugiyama et al. .......... 386/111 |

FOREIGN PATENT DOCUMENTS

| | | |
|---|---|---|
| EP | 774 869 | 5/1997 |
| GB | 2 293 516 | 3/1996 |
| JP | 3-9684 | 1/1991 |
| JP | 5-68243 | 3/1993 |
| JP | 6-14314 | 1/1994 |
| JP | 6-284405 | 10/1994 |
| JP | 7-38888 | 2/1995 |
| JP | 7-107479 | 4/1995 |
| JP | 8-23535 | 1/1996 |
| JP | 8-98138 | 4/1996 |
| JP | 8-137817 | 5/1996 |
| JP | 8-265751 | 10/1996 |
| JP | 8-275158 | 10/1996 |
| JP | 9-107547 | 4/1997 |
| JP | 9-200749 | 7/1997 |

* cited by examiner

*Primary Examiner*—Gims Philippe
(74) *Attorney, Agent, or Firm*—Merchant & Gould P.C.

(57) ABSTRACT

A variable length encoding apparatus such as an encoding apparatus using the MPEG standard, wherein without degrading the precision of quantization step, the generated code bit amount is limited. Encoding is performed at the quantization step of required picture quality by an encoding part 106, and a bit stream 141 is written in an external memory 101. The generated encoded bit amount is measured from the increment of a write pointer 121 increased because of the writing in the external memory 101 by a control unit 107. If the amount is larger than a preset value, the data is replaced with data leading to the same decoding result as those of the preceding or following reference picture by using a replacement pattern in accordance with the picture type and the position on a times series, and the data is written in the external memory 101, thus outputting the data as an output bit stream 111 controlled to the generated code amount within an upper limit value.

7 Claims, 8 Drawing Sheets

(a)

(b)

(c)

(d)

(a)

The generated code amount over the upper limit
Replace with the preceding reference picture (b)

Replaced with picture a (a)

The generated code amount over the upper limit
Replace with the following reference picture (b)

Replaced with picture e (a)

The generated code amount over the upper limit
Replace with the nearest encoded reference picture (b)

Replaced with picture b (a)

The generated code amount over the upper limit
Replaced with the preceding reference picture (b)

Replaced with picture a

VARIABLE-LENGTH ENCODER

FIELD OF THE INVENTION

This invention relates to a variable length encoding apparatus used for data compression processing.

DESCRIPTION OF THE RELATED ART

The moving picture data compression processing is a typical usage of the conventional variable length encoding apparatus.

In MPEG (Moving Picture Experts Group) standard, which is the international standard of the moving picture data compression, the differential processing with DCT (discrete cosine transform), quantization, and a motion compensation is carried out. In MPEG standard, the motion compensation is processed based on the unit composed of the pixel of 16 in length and 16 in width, which is called a macro block, for improving the compression efficiency.

In MPEG, variable length encoding is processed, however, this variable length encoding is used for decreasing the code length stochastically, so that it is not sure whether the generated encode bit amount is always decreased or not. Moreover, the generated encode bit amount will fluctuate corresponding to the difficulty of the encoding processing such as the moving picture data encoding and the video data encoding.

The fluctuation of this generated encode bit amount is controlled by the buffer model of the decoder. Practically, it is specified by the standard that the input buffer should exist in the ideal decoder when a real-time decode is performed and a system should operate decoding without overflow or underflow to this input buffer. According to the MPEG specification, the generated bit amount fluctuation is accepted if it is within the capacity of the input buffer of the decoder. However, in other words, the encoding apparatus should perform encoding under this limit.

In this way, the variable length encoding is performed in MPEG and the generated encode bit amount should be controlled. Generally, the method for generated encode bit amount control is called the rate control. As a rate control technology, a method for controlling a step in a normal quantization is known, which is disclosed by the Japanese laid open publication Tokkai-Hei 7-107947. Another method for controlling the generated encode bit amount after performing a variable length encoding is known, which is disclosed by the Japanese laid open publication Tokkai-Hei 6-14314.

By the method for enlarging the quantization step, the generated encode bit amount can be decreased to some extent. However, the actual generated encode bit amount is not known until encoding processing actually is performed. This means that the method for controlling the quantization step has a problem of credibility because this method can not forecast the generated encode bit amount practically in advance. When the quantization step is controlled by the macro block unit, the conventional method still has a problem that a picture quality will be deteriorated even for data which will be encoded with high picture quality if it is encoded in a normal encoding method because the above mentioned method should control the upper limit of the generated encode bit amount considering the possible worst condition, which rarely actually occurs. Especially in a real time encoding system, re-encoding processing for re-encoding the encoded data in order to optimize the encoded result is almost impossible, so that there is no way but performing the above mentioned method for ensuring such limit, and the picture quality is deteriorated.

The above mentioned problem will be solved by controlling the bit amount after performing the variable length encoding, however, by the method disclosed in the Japanese laid open publication Tokkai-Hei 6-14314, the hardware scale will be enlarged because the full length of the variable length code should be memorized, in addition, in some cases, the picture quality deterioration by a mismatching of the locally decoded picture and the decoded picture by the decoder can occur in several serial frames. In addition, there is a problem that the picture quality deterioration is concentrated occasionally to a specific macro block, so that the picture quality deterioration is seen remarkably easily.

DISCLOSURE OF THE INVENTION

It is an object of the variable length encoding apparatus of the present invention to solve the above mentioned problem and to provide a control of the upper limit of the generated encode bit amount surely without the remarkable picture quality deterioration in a real time processing.

In order to achieve the above objects, the variable length encoding apparatus of the present invention includes a variable length encoding means for encoding an input data into variable length code processing unit by processing unit, a buffering means for temporarily storing the variable length encoding data processed by the variable length encoding means and a code replacement processing means for replacing the variable length encoding data stored in the buffering means with a prepared short code which code amount is less than that of the variable length encoding data according to the generated code amount of the variable length encoding data.

By the above mentioned embodiment, in the variable length encoding processing, a data which has large code amount per a processing unit can be replaced with a short code according to the necessity, and the encode amount per one processing unit will be decreased, so that the encode bit amount can be controlled surely within the upper limit.

Next, the variable length encoding apparatus further includes a means for setting the upper limit of the generated code amount per one processing unit of the input data, wherein the code replacement processing means comprises a means for replacing the variable length encoding data stored in the buffering means with the prepared short code when the generated code amount of the processing unit of the variable length encoding data exceeds the upper limit, a means for executing no operation of replacing the encoded data when the generated code amount of the processing unit of the variable length encoding data does not exceed the upper limit.

By the above mentioned embodiment, the upper limit of the generated code amount per one processing unit can be controlled flexibly, in the variable length encoding processing, the generated encode bit amount per one processing unit which exceeds the upper limit can be replaced with a short code, so that the encode bit amount can be surely controlled within the upper limit.

Next, it is preferable that the input data is an intraframe compression data or an interframe compression data of a motion picture, and the processing unit is data per one picture of a motion picture.

By the above mentioned embodiment, this invention can be applied to a variable length encoding processing in the motion picture data compression processing, so that this invention can be utilized in a variable length encoding processing in the motion picture data compression processing of MPEG standard, the H.261 standard or the like.

Next, it is preferable that the prepared short code which the code replacement processing means uses at code replacement processing is data leading to the same decoding result as the preceding processed replaced data of the processing unit of the code replacement processing by the code replacement processing means.

By the above mentioned embodiment, when decoding the replaced data, the decoded picture will be the same as the previous picture which has already been decoded previously, so that an observer does not recognize the picture quality deterioration.

Next, it is preferable that the code replacement processing means replaces the input data with the prepared short code input data when the input data is a bidirection prediction encoding picture, and selects the data leading to the same decoding result as either one of an intraframe encoding picture which is preceding at a nearest position in time series, a forward prediction encoding picture which is preceding at a nearest position in time series, an intraframe encoding picture which is following at a nearest position in time series or a forward prediction encoding picture which is following at a nearest position in time series if it is decoded.

By the above mentioned embodiment, a bidirection prediction encoding picture data, which has the necessity of being replaced, can be replaced with the picture data which is the nearly preceding picture or nearly following picture to the replaced picture and which code amount is within the predetermined code amount, so that an observer does not recognize the picture quality deterioration when decoding the motion picture.

Furthermore, at the above data selection, when the data corresponding to the following picture is selected, it preferable that all bidirection prediction encoding pictures between the input data and the selected following picture are replaced with the data leading to the same decoding result as the selected following picture if it is decoded.

By the above mentioned embodiment, in the code replacement processing of the bidirection prediction encoding picture data, picture data following the replaced picture data does not become a picture of the past in the time series, so that an observer does not recognize the picture quality deterioration when decoding to the motion picture because there is no disorder of the picture in time series.

Next, it is preferable that the code replacement processing means replaces the input data with the prepared short code input data when the input data is a forward prediction encoding picture, and selects the data leading to the same decoding result as either one of an intraframe encoding picture which is preceding at a nearest position in time series, a forward prediction encoding picture which is preceding at a nearest position in time series, a forward prediction encoding picture following to the forward prediction encoding picture which is the input data refers the selected preceding picture if it is decoded.

By the above mentioned embodiment, a forward prediction encoding picture data which has necessity to be replaced can be replaced with the picture data which is the nearly preceding picture to the replaced picture and which code amount is within the predetermined code amount, so that an observer does not recognize the picture quality deterioration when decoding to the motion picture. In addition, in the referencing processing of a forward prediction encoding picture following to the previously replaced forward prediction encoding picture, the forward picture is referred so that the replaced forward prediction encoding picture will not be referred in the other picture referencing processing, no problem will occur.

DESCRIPTION OF THE PREFERRED EMBODIMENTS

An embodiment of the variable length encoding apparatus of the present invention applied to the MPEG encoder is shown below.

Figure 1:
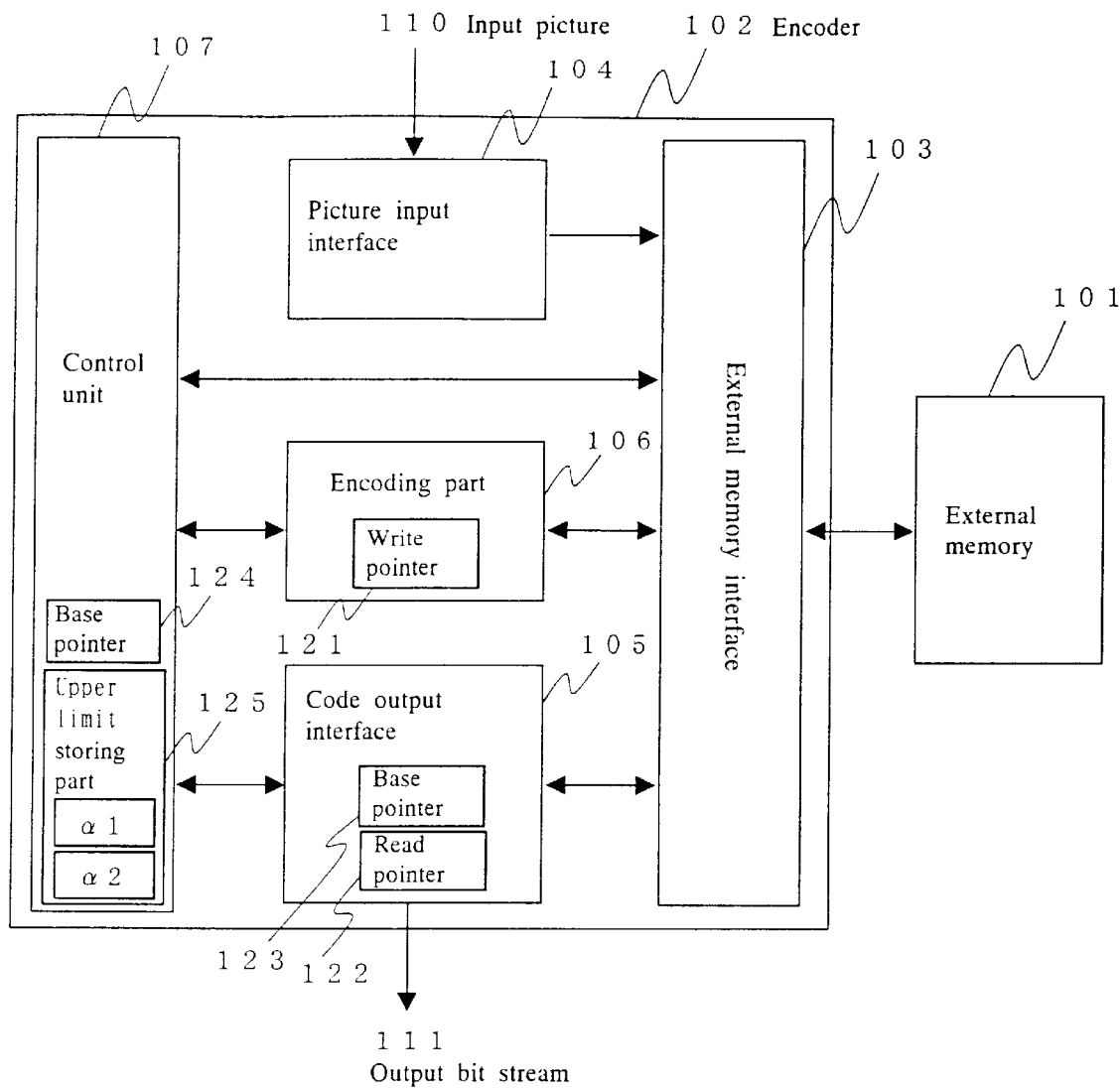
FIG. 1 is a block diagram of MPEG encoding apparatus of an Embodiment of this invention.

FIG. 1 is a block diagram of a MPEG encoder of this Embodiment. It includes an external memory 101, and an encoder 102 as shown in FIG. 1.

The encoder 102 includes an external memory interface 103, a picture input interface 104, a code output interface 105, an encoding part 106 and a control unit 107.

The encoding part 106 corresponds to the variable length encoding means, the external memory 101 corresponds to the buffering means, and the code replacement processing means is executed by the controlling of the control unit 107 as described later. The processing unit is a picture in this Embodiment, and the picture types are I picture (intraframe compression encoded picture), P picture (forward directional prediction encoded picture), and B picture (bidirectional prediction encoded picture).

The external memory 101 plays the role as a buffer for buffering a referred picture data and a bit stream of the encoded data in order to output it at a constant bit rate.

The external memory interface 103 arbitrates a write request and a read request from plural blocks such as the picture input interface 104, the codes output interface 105 and the encoding part 106 and performs the data input and data output between other blocks and the external memory.

After inputting the input pictures 110 and filtering them, the picture input interface 104 writes the input picture data 110 in a predetermined address of the external memory 101 through the external memory interface 103. Hereinafter, the written picture data is called source picture data.

The encoding part 106 reads picture data from the external memory 101, executes the encoding processing, and writes the encoded data into the external memory 101. The code replacement processing is executed if the control unit 107 judges that the amount of the generated encode data is more than the predetermined upper limit, and the replaced data are written into the external memory 101. The detail processing will be described later.

Here, a write pointer 121 is a pointer to show the address of the written data on the external memory 101, and the write pointer 121 will be increased only by the generated code amount in the encoding processing. As described later, the write pointer 121 before the start of the encoding processing is passed to the base pointer 124 of the control unit 107 and the write pointer 121 after encoding processing also is passed to the control unit 107 and these are utilized to judge whether the generated encode data amount which has been written in the external memory 101 has exceeded the upper limit or not.

The control unit 107 controls the encoding part 106 and the code output interface 105, and inputs and outputs data directly to the external memory 101 through the external memory interface 103. The upper limit of the generated encode data amount is set and maintained in the upper limit storing area 125, and the necessity of the code replacement processing is judged by checking whether the generated encode data amount after encoding by the encoding part 106 exceeds the set upper limit or not, and if exceeds, the code replacement processing according to the replacement pattern is performed while considering the arrangement in time series and the picture type of the handled picture data. Here, the upper limit can be set according to the picture type, the upper limit for the B type picture data is set as α1, for the P type picture data is set as α2. The base pointer 124 is the pointer for receiving and storing the initial value of the write pointer 121 in the encoding part 106 before the encoding processing is executed. It is used for the calculation of the generated encode data amount generated in the encoding processing by calculating the difference from the value of the write pointer 121 stored after the encoding processing. The detail processing is described later.

The code output interface 105 includes a read pointer 122 and a base pointer 123 internally, and outputs the bit stream 111 according to the request from the outside while comparing these pointers. Here, the read pointer 122 is a pointer for storing the address of the external memory 101 which shows the range that the output of the bit stream has already finished, and the base pointer 123 is a pointer for storing the address of the external memory 101 which shows the range that the encoding processing and the code replacement processing has already finished and the point enable to output. The detail output processing is described later.

Hereinafter, the configuration of the encoding part 106 will be described, then the processing for the judgment of the necessity of the replacement, the replacement pattern determination processing, the code replacement processing, and the output processing through the code output interface 105 will be described in detail.

Figure 2:
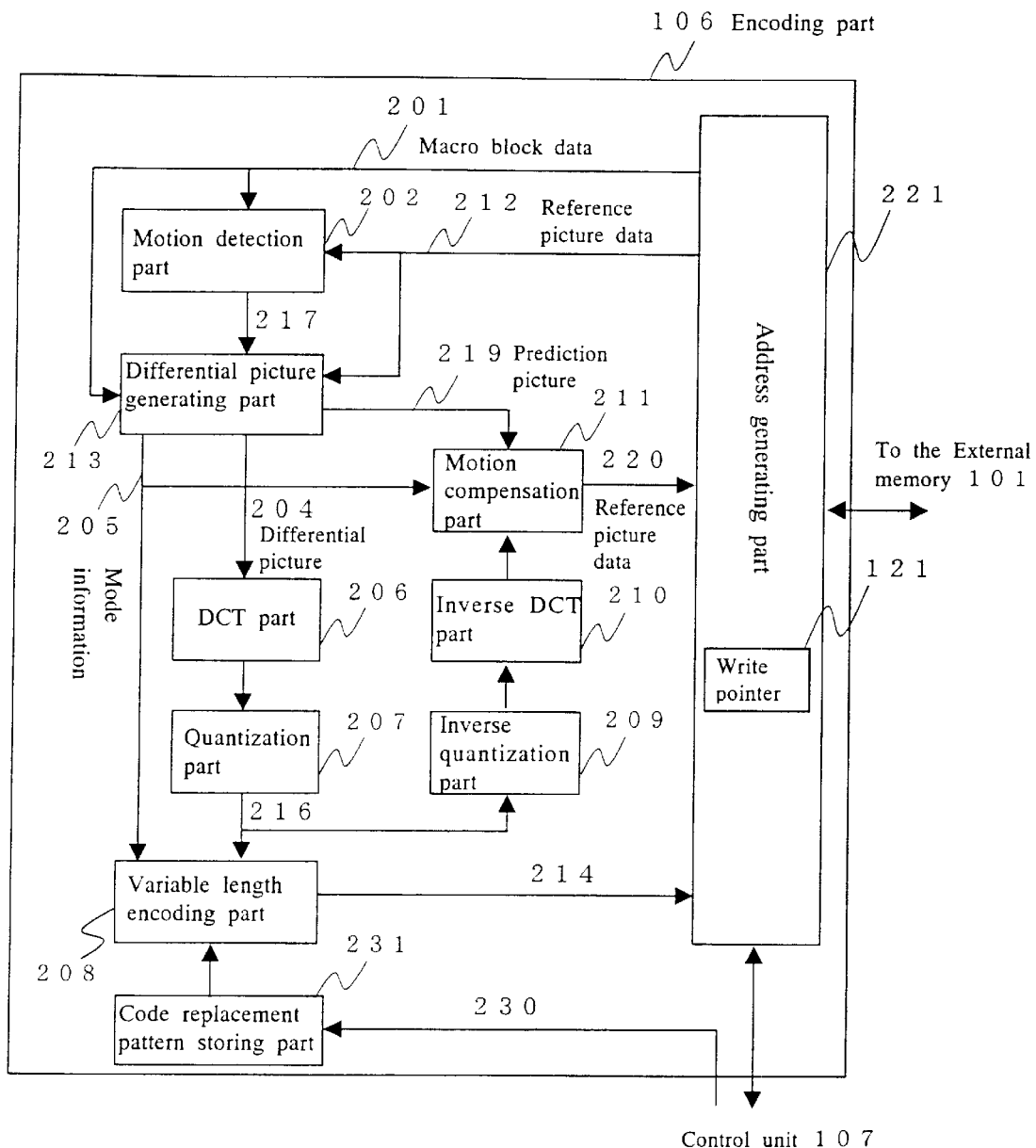
FIG. 2 is a block diagram which shows details of the encoding part 106 in FIG. 1.

First of all, the configuration of the encoding part 106 is described. As shown in FIG. 2, the encoding part 106 includes the address generation part 221 where the address is generated to read and write the processing picture data between the external memories 101. The address generation part 221 stores the above-mentioned write pointer 121. The encoding part 106 further includes a motion detection part 202, a difference picture generation part 213, a DCT part 206, a quantization part 207, a variable length encoding part 208, an inverse-quantization part 209, a inverse-DCT part 210, and a motion compensation part 211.

A macro block data 201 is a macro block data of 16×16 pixels. The motion detection part 202 handles the reference picture data 212 read from the external memory 101 as a search area, tries the comparison of the macro block data of 16×16 pixels of the and reference picture data 212 with the macro block data 201 of the processing objects, and detects the block data that matches the most. The vector represents the difference of the position of the macro block data 201 and the detected block data and is outputted to the difference picture generation part 213 as a motion vector 217.

The difference picture generation part 213 generates the prediction picture 219 from picture data corresponding to the inputted macro block data 201 of the reference picture data 212 stored in the external memory 101 based on the provided motion vector 217. The difference picture generation part 213 outputs the difference between the macro block data 201 and the prediction picture 219 as the differential picture data 204 in the interframe compression, and outputs the same data as the macro block data 201 without performing the differential processing as the differential picture 204 in the intraframe compression. Here, the difference picture generation part 213 outputs the information for indicating that the processing mode is an inter mode or an intra mode and outputs the information of the motion vector 217 as a mode information 205.

The DCT processing part 206 performs the discrete cosine transform, which is one of the orthogonal transformation to the differential picture 204 and outputs the results.

The quantization part 207 performs the quantization of the output data of the DCT processing part 206, and outputs the results as the quantized data 216. The data amount of the DCT processing results is compressed by this quantization processing by eliminating the high frequency component.

The variable length encoding part 208 outputs the quantized data 216 as output bit stream 214 by processing the variable length encoding based on the mode information 205 and the data incidence. Here, the mode information 205 containing the motion vector 217 is encoded into the output bit stream 214. As described later, when the generated encode data amount of the variable length encoding data is judged whether it exceeds the set upper limit of α1 or α2 or not in the code replacement processing performed by the control unit 107, and the variable length encoding data is replaced with the replacement pattern which stored in the replacement pattern storing part 231 according to the replacement pattern signal 230 outputted by the control unit 107, the replaced data is outputted as the bit stream 214.

In addition to generating the above mentioned bit stream 214, the encoding part 106 performs the processing the same as the decode processing performed in the decoder by the inverse-quantization part 209, the inverse-DCT part 210, and the motion compensation part 211 in order to generate the reference frame picture data 220 for the next encoding processing.

The inverse-quantization part 209 performs an inverse-quantization of the quantized data 216. Here, the processing corresponds to the inverse transformation of the quantization, however, the output of the DCT part 206 does not match with that of the inverse-quantization part 209 because the information amount is decreased and eliminated in the quantization processing.

The inverse-DCT part 210 processes the inverse-DCT to the output of the inverse-quantization part 209.

The motion compensation part 211 performs the motion compensation based on the mode information 205 and the prediction picture 219. The motion compensation outputs the result of the inverse-DCT part 210 as it is when the mode information 205 indicates the intra mode, and outputs the calculated data by adding the predirectional picture 219 and the inverse-DCT part 210 when the mode information indicates the inter mode. This processing corresponds to the opposite of the processing executed in the difference picture generation part 213. The output of the motion compensation part 211 is sent to the address generation part 221 as the reference picture data 220, then written to the external memory 101 though the external memory interface 103, and it is used for the next stage encoding processing of the macro block data 201.

As mentioned above, the encoding part 106 encodes the source picture data and generates the bit stream by performing the code replacement processing if necessary, and the result is written to the external memory 101.

In MPEQ as for the motion compensation in the encoding processing, different processing is performed according to the picture coding type of the input frame picture. The encoding part 106 modifies the operation of the motion detection part 202 and the motion compensation part 212 according to the kind of three kinds of picture coding types (I picture, P picture, and B picture) specified by the control unit 107.

In case of I picture type, neither the information between frames nor the reference picture is used, data is encoded by performing neither the motion compensation nor the motion detection, and the local decode picture is written in the external memory 101. The motion detecting part 202 does not output the motion vector 217, and the differential picture generation part 213 does not use the reference picture 212 and always performs the operation in the Intra mode (wherein the motion compensation is not performed).

In case of P picture, encoding is performed by using only one reference frame picture which exists forward for P picture on the time series and using the motion prediction to the reference picture, and the local decode picture is written in the external memory 101.

In case of B picture type, two frames, for instance, nearly preceding and following two reference frames of I picture or P picture on the time series are used as a reference picture. Regarding this type, the local decode picture is not written in the external memory 101. That is, the address generation part 221 does not perform the operation to write the reference picture data 220 in the external memory 101. Because, the picture of B picture type is not used as a reference picture so that there is no need to maintain the local decode picture. In other words, it is understood that the data modification operation to the B picture type data does not affect other frame pictures at all. On the other hand, the operation of the modification of the data of I picture type and P picture type affects the picture of other frames.

The above description is a configuration of the encoding part 106.

Figure 3:
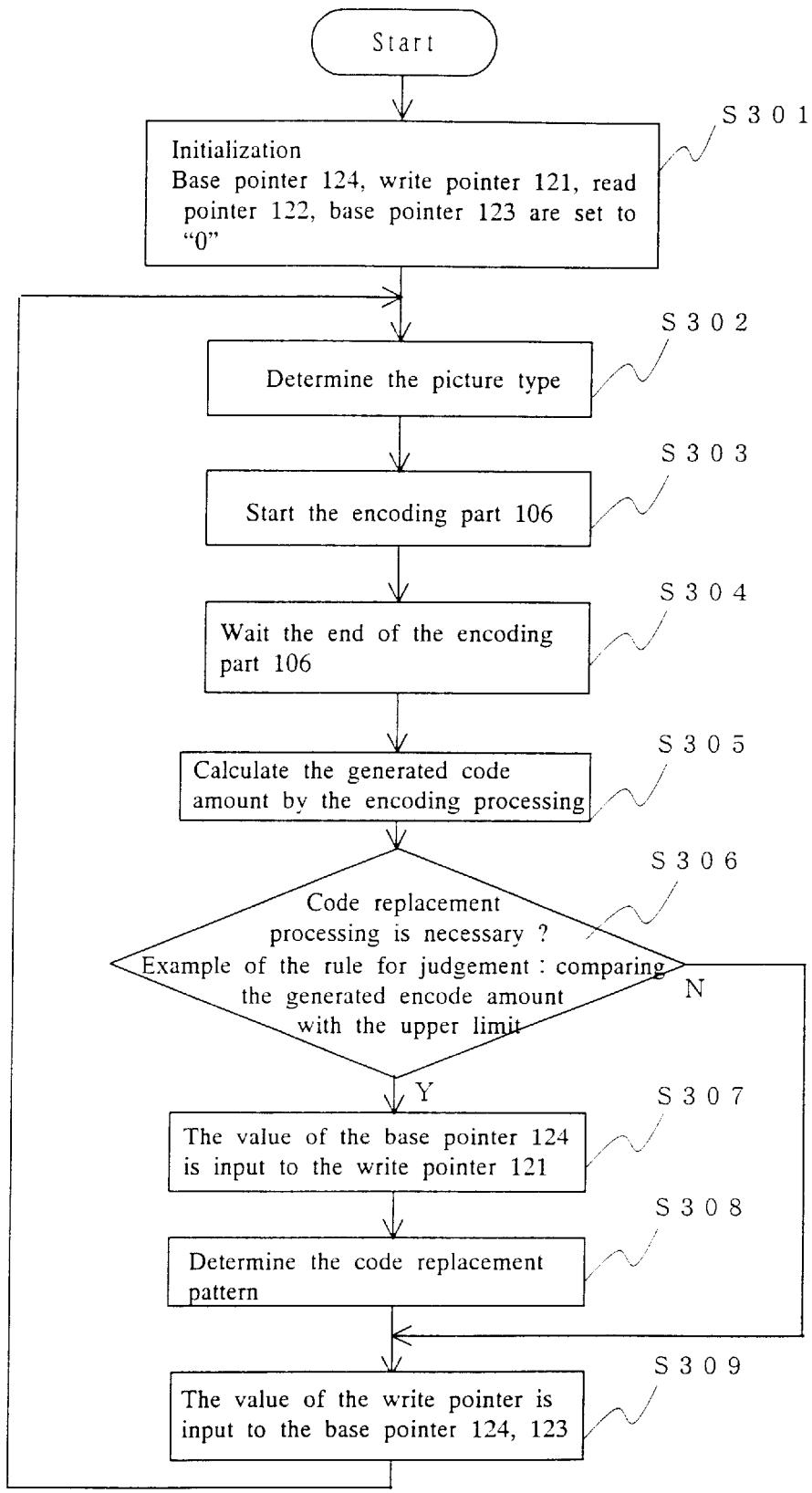
FIG. 3 is a flow chart of the processing operation of the control unit 107.
Figure 4:
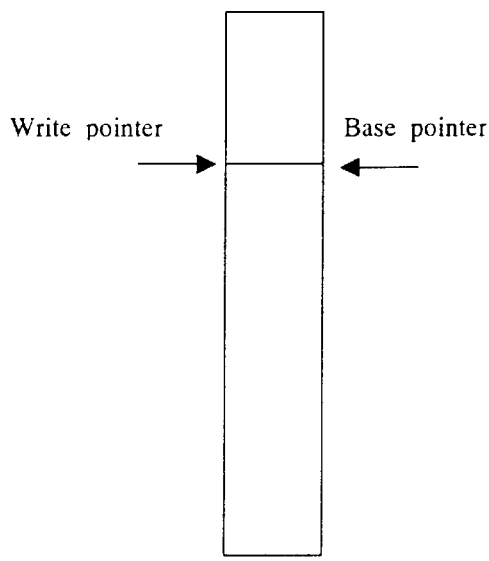
FIG. 4 is a diagram showing the concept of the data writing in the external memory 101.
Figure 4:
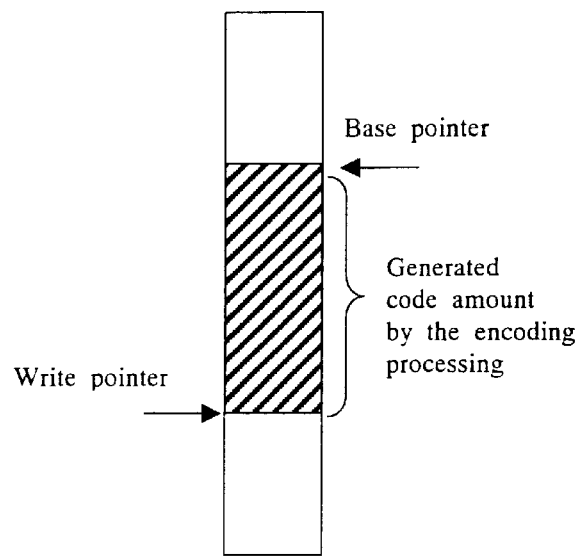
Figure 4:
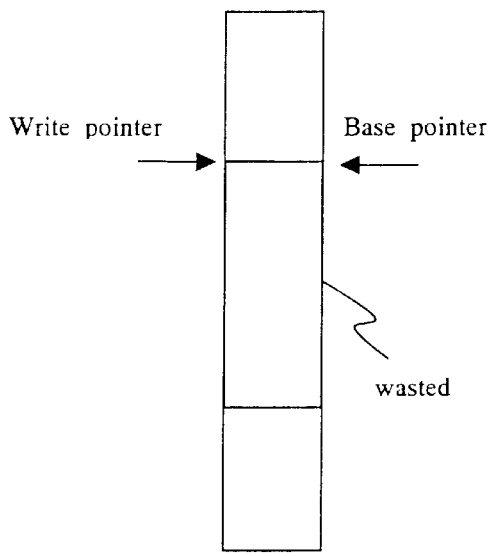
Figure 4:
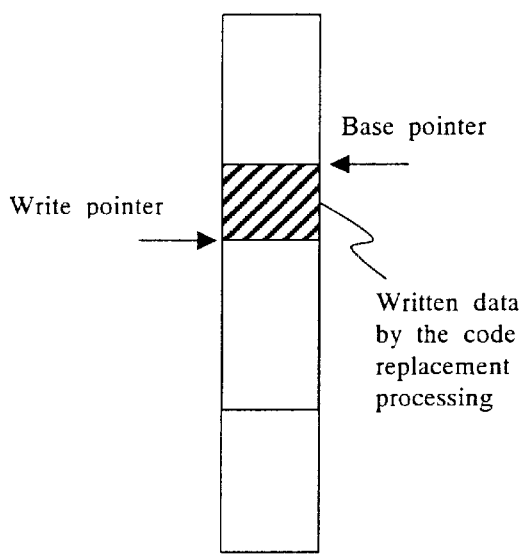

Next, the MPEG encoding processing procedure utilizing the variable length encoding apparatus of this Embodiment is described below. FIG. 3 is a processing flowchart of the variable length encoding apparatus of this invention, which mainly shows the processing operation of the control unit 107. FIG. 4 is a figure which shows the concept of data writing in the external memory 101.

The input picture 110 is written in the external memory 101 through the picture input interface part 104 as the source picture. This operation performs independently from other blocks. In the below description, the source picture has already been taken into the external memory 101.

First of all, the control unit 107 performs the initialization processing (step 301). In initialization, the write pointer 121 in the encoding part 106, the read pointer 122 and the base pointer 123 of the code output interface 105, the base pointer 124 stored in the control unit 107 are set to "0" respectively.

Next, the determination of the picture type (step 302) is executed. The sequence of the picture type is determined by the encoding apparatus side in MPEQ, and the control unit 107 specifies the sequence of the picture type, for example, the order of the picture type in repetition of I, B, B, B, P, B, B, B, I, . . . .

Next, the start processing (step 303) in encoding part 106 is executed, and the process enters the waiting loop (step 304) for processing termination of the encoding part 106. The write pointer 121 and the base pointer 124 matches with each other at the starting time of the encoding part 106 as shown in FIG. 4(a). Next, the encoding part 106 takes one picture data from the external memory 101, and executes the encoding processing, and writes the encoding processing result in the external memory 101. The write pointer 121 in the encoding part 106 will be increased according to the written encoded data amount (FIG. 4(b)). At this time, the value of the base pointer 123 in the code output interface 105 is the same as the previous value so that the data under encoding process is not output to the outside.

Next, when the encoding part 106 ends the encoding processing for one picture, the control unit 107 executes the generated encoded data amount calculation process (step 305). This generated encoded data amount calculation process is performed by the control unit 107 by comparing the value of the write pointer 121 in the encoding part 106 and the base pointer 124 which stored in the control unit 107. Because the write pointer is increased in proportion to the amount of the generated encoded data when the encoding result is written, the amount of the generated encoded data can be calculated by calculating the increment of the pointer.

Next, the judgement process whether the replacement process is performed or not judgement for the necessity of the replacement process) (step 306) is performed. Here, the generated encode data amount calculated in the step 305 is checked as to whether it exceeds the upper limit or not. If the picture type of the picture data under processing is B picture type, the upper limit $\alpha 1$ is used, and if the picture type of the picture data under processing is P picture type, the upper limit $\alpha 2$ is used. If the generation encode data amount is within an upper limit, the process will advance to the step 309, if it exceeds, the process will advance to the code replacement processing in step 307. The example shown in FIG. 4b is the case that the generated encode data amount exceeds the upper limit (for instance, $\alpha 1$).

When the generated encode bit amount exceeds the upper limit in step 306, the code replacement processing (step 307 and step 308) is executed. First of all, the base pointer 124 of the control unit 107 is returned to the write pointer 121 in the encoding part 106 in step 307. As a result, the write pointer 121 in the encoding part 106 returns to the former value before the encoding result is written (FIG. 4(c)). Next, at the step 308, the control unit 107 determines the replacement pattern according to the picture type of the picture data and the position in the time series of the picture data under processing, and outputs the replacement pattern signal 230 to the encoding part 106. The encoding part 106 adopts the specified data of the replacement pattern stored in the replacement pattern storing part 231 as the encoded data according to the received replacement pattern signal 230, and the external memory 101 is overwritten from the address indicated by the write pointer 121, which has been returned to the former value. The value of the write pointer 121 is updated to the address of the point where the replacement data has already overwritten (FIG. 4(d)). The remaining data is disregarded, the next processing is continued from the value of the write pointer of FIG. 4(d), and the processing result of the following picture data is written.

Data stored in the replacement pattern storing part 231 are the following 2 kinds.

(1) The data that is generated by encoding all macro blocks under the condition of the forward prediction mode, the motion vector 0, and the difference data 0 (data by leading to the same decode result as the forward reference picture if it is decoded).

(2) The data that is generated by encoding all macro block under the condition of the backward prediction mode, the motion vector 0, and the difference data 0 (data by leading to the same decode result as the backward reference picture if it is decoded).

As for these short data, it is possible to prepare beforehand without the source picture as a predetermined code and data amount is also very little. Details of the above-mentioned replacement pattern determination processing will be described later.

Next, the control unit 107 performs the pointer update for the output processing (step 309). First of all, the value of the write pointer in the encoding part is input to the base pointer 124 and the base pointer 123 of the code output part 105.

The output processing through the code output interface 105 is as follows. When there is an output requesting, the code output interface 105 reads the encode bit until the value of the read pointer 122 matches with the base pointer 123 and outputs the read data as output bit stream 111.

(1) When the read pointer 122 and the base pointer 123 do not match, the data of the address indicated by the read pointer 122 is read out from the external memory 101 to the outside as output bit stream 111. After that, the value of the read pointer 122 is increased by "1".

(2) When the read pointer 122 and the base pointer 123 matches, the code output interface 105 informs that there is no data that should be outputted to the outside.

If the read pointer 122 does not increase over the base pointer 123, the data stored after the base pointer will not be outputted to the outside because the code output interface 105 performs the above-mentioned operation.

After a series of processing above shown, the process advances to the determination processing of the picture type (step 302) again.

The above-mentioned flow is programmed by using the microcode in the control unit 107.

Next, details of the replacement pattern determination processing are described. There are several patterns for the replacement pattern. In this embodiment, the replacement pattern determination performs according to the picture coding type of the picture data under processing and the position of the picture when arranging in the time series. Important points are the following two rules in the replacement pattern determination.

(1) The replaced data must obtain the same decoding result as the reference picture that is adjacent in time series. As a result, the reproduced picture of the picture data after replacement becomes similar to the picture in the vicinity in the time series, and the reproduced motion picture becomes less strange.

(2) Do not reverse the arrangement of the time series of the picture data after replacement with the picture. By this rule, reproduced motion picture has no disordered picture in time series so that the reproduced motion picture becomes less strange.

Each replacement pattern is described below paying attention to the above-mentioned two points.

Figure 5:
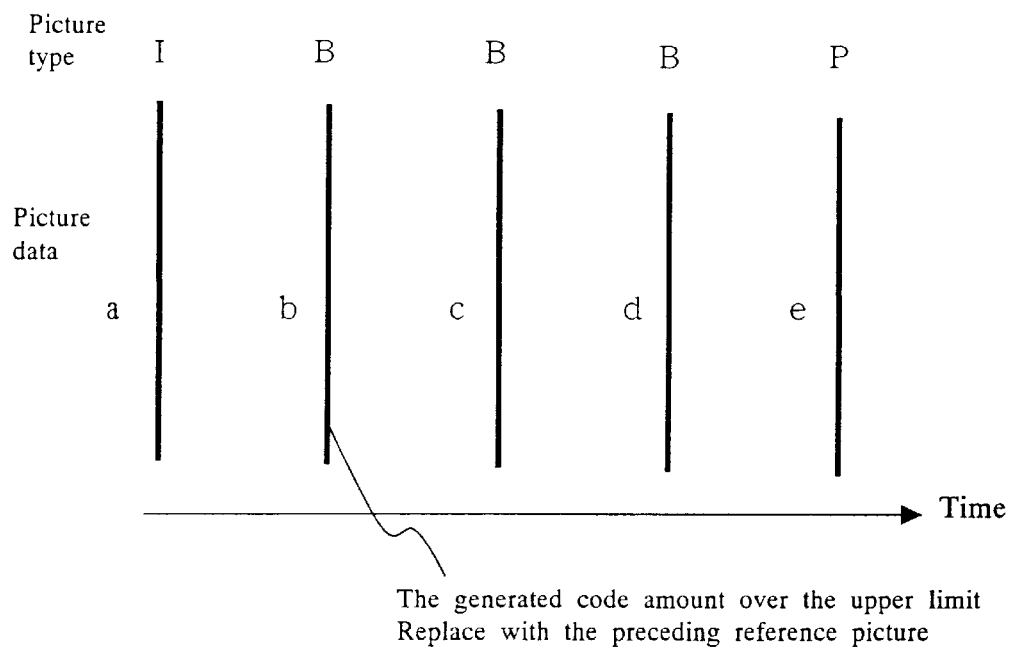
FIG. 5 is a diagram which shows a replacement pattern 1.
Figure 5:
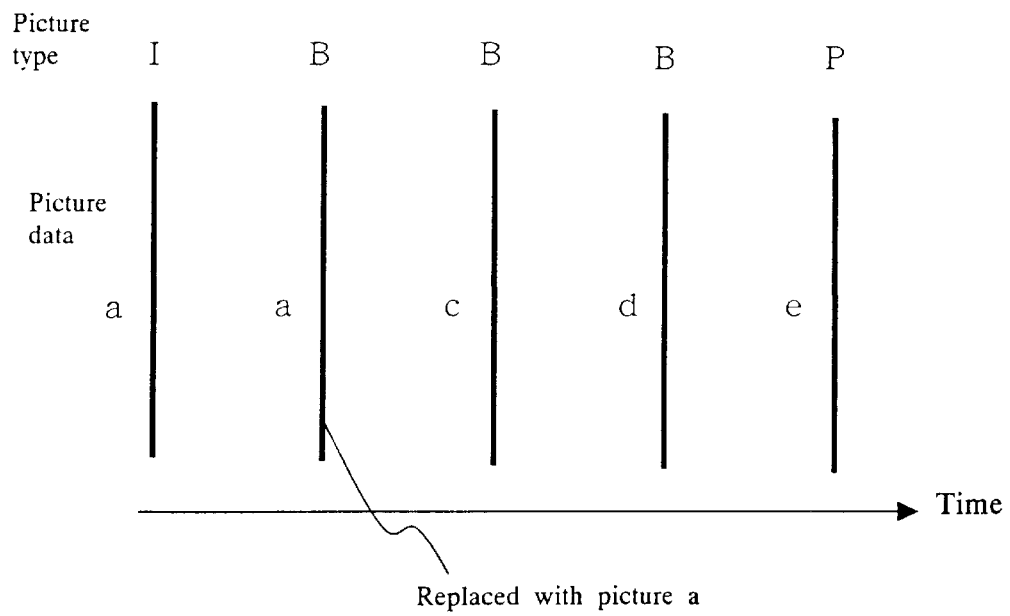

Regarding pattern 1, it will be used when the picture coding type is B type, and the processed picture corresponds to the picture after the preceding reference picture (I picture or P picture) and the generated encode data amount as the result of the encoding exceeds α1. This pattern 1 is a pattern for replacing the encoded data of the B type picture under processing with the data leading to the same decode result as a preceding reference picture if it is decoded. One example is shown in FIG. 5. FIG. 5(*a*) shows the concept of the picture data before the code replacement processing arranged in order of the time series, and FIG. 5(*b*) shows the concept of the display order of the motion picture after the code replacement processing. The picture type sequence is I, B, B, B, P as shown in FIG. 5(*a*), and each picture is represented as a, b, c, d, and e respectively. This pattern 1 corresponds to the case that the generated encode data amount of picture b exceeds α1.

Here, the generation processing for replacement pattern signal and the code replacement processing for pattern 1 are described. Because the order of the encoding processing is executed in order of I, P, and B, the code replacement processing is performed in order of a, e, b, c, and d. After encoding the picture b, if the code replacement processing is determined to be processed in the code replacement processing determination in the control unit 107 in step 306, the control unit 107 can judge whether the picture under processing is picture type B and belongs to pattern 1 because it is placed after the preceding reference picture, and the control unit 107 specifies the data stored in the replacement pattern storing part 231 for replacement data leading to the same decode result as the preceding reference picture if it is decoded. At this time, the decoding result becomes the same as picture a. The reproduced picture becomes a, a, c, d, and e by the code replacement processing in step 308. Only picture a is continuously displayed only in a short time, and the sense of strangeness of appearance can be reduced.

Figure 6:
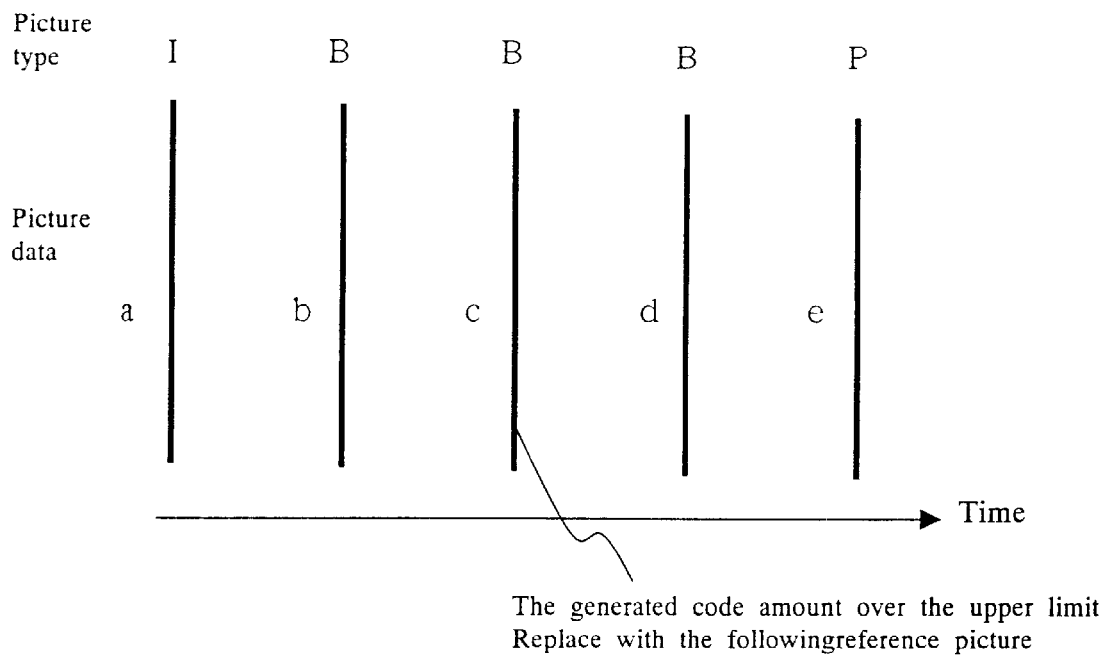
FIG. 6 is a diagram which shows a replacement pattern 2.
Figure 6:
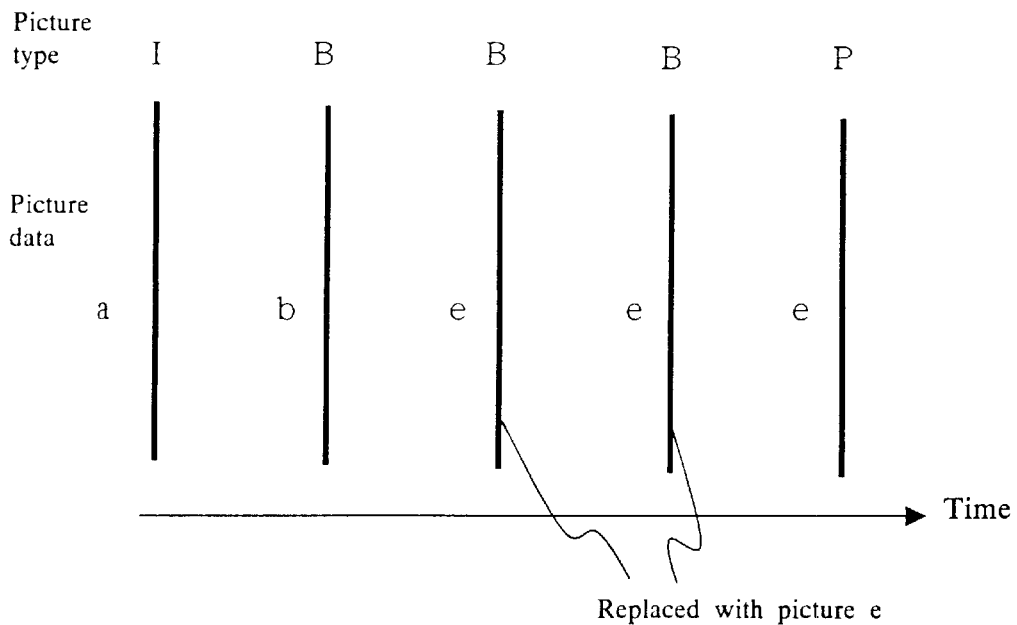

Next, pattern 2 is described. The pattern 2 will be used when the picture coding type is B type, and the generated encode data amount as the result of the encoding exceeds α1, and this pattern is a pattern for replacing the encoded data of B type picture under processing with the data leading to the same decode result as the following reference picture if it is decoded. Especially, this pattern 2 is used when the order in the time series of the processing picture data is close to the following reference picture side, or when other encoded picture data, which data amount is within the predetermined code amount exists between the processing picture and the preceding reference picture. One example is shown in FIG. 6. FIG. 6(*a*) is the figure that shows the appearance of the picture data arranged in order of the time series before performing the code replacement processing, and FIG. 6(*b*) is the figure that shows the appearance of the motion picture to be displayed after performing the code replacement processing. The picture sequence is I, B, B, B, P as shown in FIG. 6(*a*), each picture is represented as a, b, c, d, and e respectively. This pattern 2 corresponds to the case that the generated encode amount of picture c or picture d exceeds α1. Here, the generated encode data amount of picture c exceeds α1.

Here, the generation processing for replacement pattern signal and the code replacement processing for pattern 1 are described. The same as pattern 1, because the order of the encoding processing is executed in order of I, P, and B, the code replacement processing is performed in order of a, e, b, c, and d. After encoding the picture c, if the code replacement processing is determined to be processed in the code replacement processing determination in the control unit 107 in step 306, the control unit 107 judges the picture under processing is picture type B and judges that it belongs to pattern 2 because an other picture b exists between the picture and the preceding reference picture a, and the control unit 107 outputs the replacement pattern signal 2, and specifies the data stored in the replacement pattern storing part 231 for replacement data leading to the same decode result as the following reference picture if it is decoded. This replacement pattern signal 2 specifies the replacement of all pictures to the following reference picture e on the picture sequence with the data leading to the same decode result as a following reference picture if it is decoded. Therefore, the reproduced picture becomes a, b, e, e, e as shown in FIG. 6(*b*) by the code replacement processing in step 308. Only picture e is continuously displayed only in a short time, and the sense of strangeness of appearance can be reduced.

Figure 7:
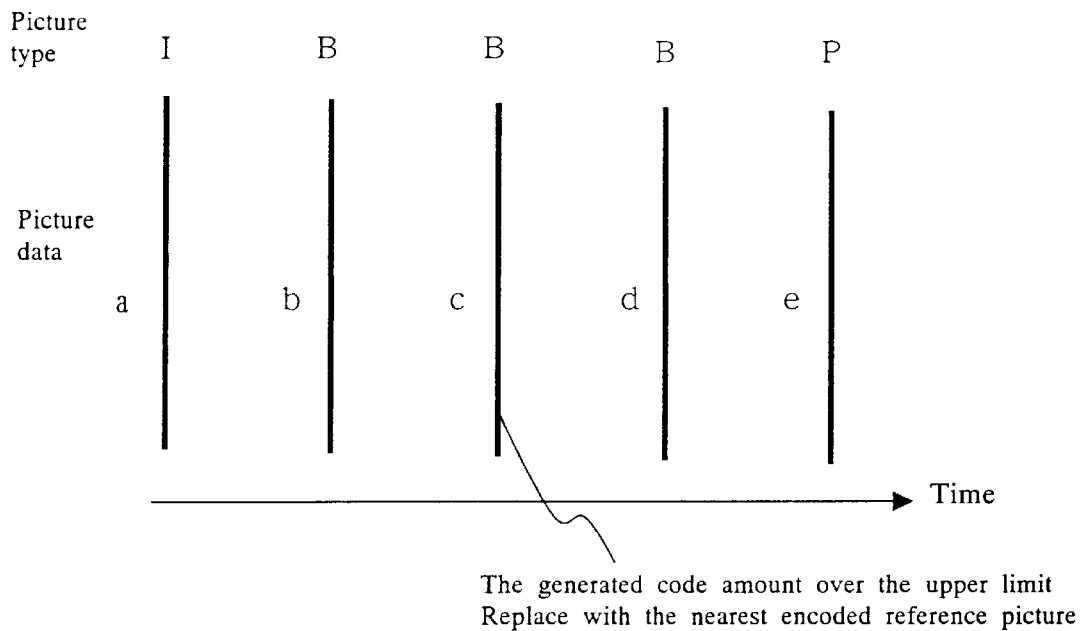
FIG. 7 is a diagram which shows another replacement pattern 2.
Figure 7:
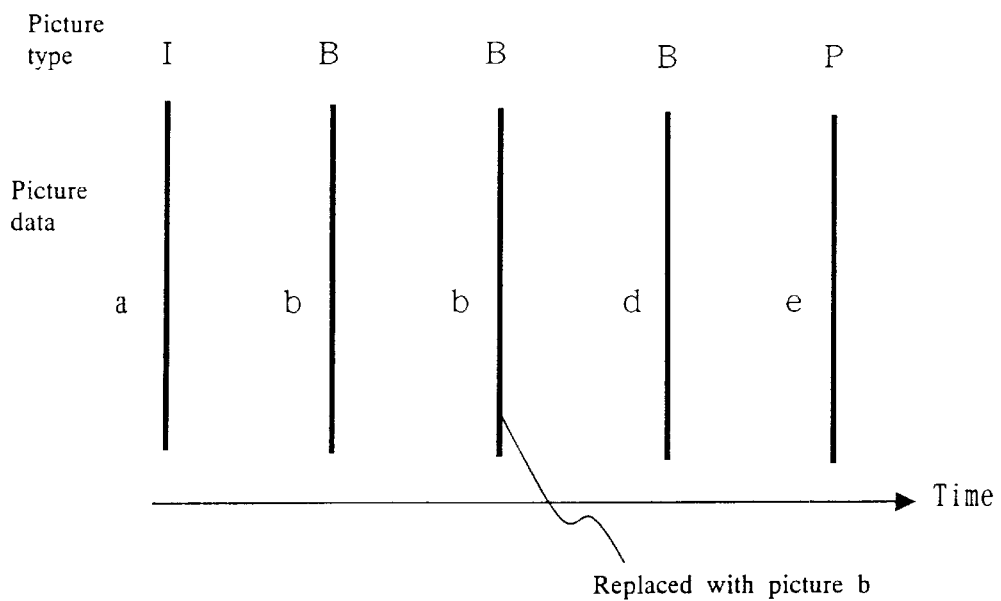

In this pattern 2, another code replacement processing can be provided as follows. This another replacement pattern 2 is described by using FIG. 7. The encoding processing is performed in order of I, P, and B so that the encoding processing is performed in order of a, e, b, c, the same as the above-mentioned replacement pattern 2. Replacement pattern storing part 231 advances processing by replacing the encoding result of the picture of B with the replacement pattern 3 until the picture data in which the generated encode amount exceeds upper limit α1 appears. Here, it is assumed that the generated encode data amount of picture c exceeds α1. After encoding the picture c, if the code replacement processing is determined to be processed in the code replacement processing determination in the control unit 107 in step 306, the control unit 107 can judge whether the picture under processing is picture type B and belongs to pattern 2 because an other picture b exists between the picture and the preceding reference picture a, and the control unit 107 outputs the replacement pattern signal 3. Here, the pattern signal 3 is the third replacement pattern, and it is specified as the data that replaces the encoding data of picture b, which is preceding B picture. Therefore, the reproduced picture becomes a, b, b, d, and e as shown in FIG. 7(*b*) by the code replacement processing in step 308.

The bit stream to be replaced is the same as the B picture for the picture b, when processing picture c, the same as picture b, bidirection prediction is performed for all the macro blocks, and the encoding processing is performed. The data for replacement is the previously encoded data of B picture, so that it is possible to prepare it beforehand, a real-time processing can be achieved because the data generation can execute at very high speed. In addition, the decoding result becomes the same picture as the preceding picture b. Only picture b is continuously displayed only in a short time, and the sense of strangeness of appearance can be reduced.

In another pattern of the above-mentioned pattern 2, the encoding data of picture b, which picture type is B, is stored in the replacement pattern storing part 231 as the replacement pattern 3, and the control unit 107 can store the address in which the encoding data of picture b, which picture type is B, is written instead. When processing the next picture c, which picture type is B, if the generated encode bit amount of the encoded result exceeds α1, the encoded data stored in the address specified by the control unit 107 is copied to the following address as the replacement encoding data for picture c. In addition, if the generated encode bit amount of the following B picture is also larger than α1, the same data is copied to the following address in the same way. Moreover, when the plural B pictures for which the code replacement processing is required are continuing, the encoding data of picture b can be copied collectively to the consecutive addresses for them. The generated encode bit amount of each B picture becomes within the upper limit α1 by the code replacement processing of this another pattern 2, only the same picture is continuously displayed only for the replaced B picture frames in a short time, and the sense of strangeness of appearance can be reduced.

Figure 8:
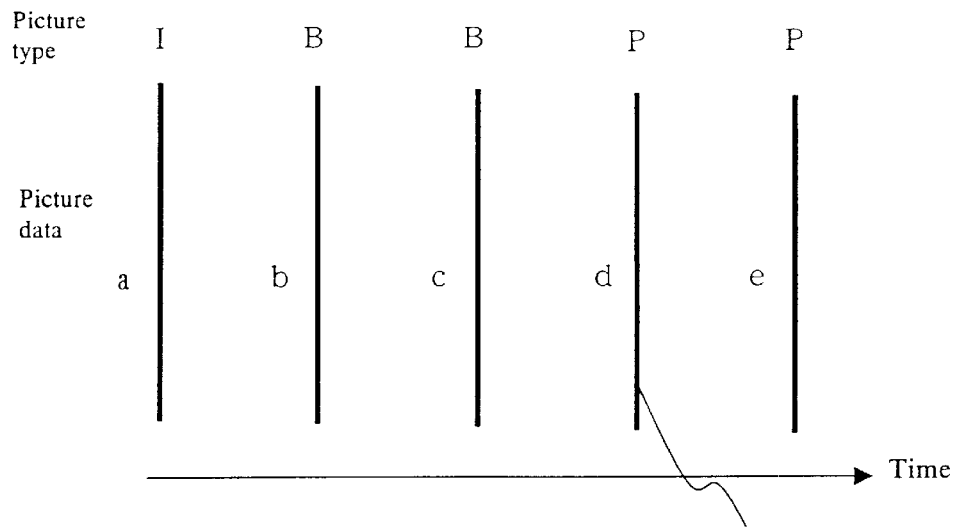
FIG. 8 is a diagram which shows a replacement pattern 3.
Figure 8:
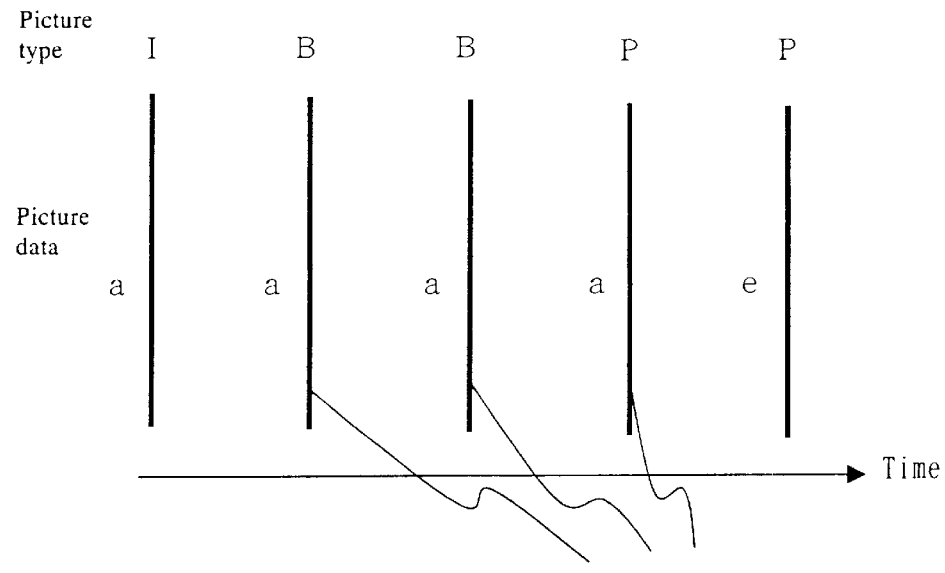

Next, pattern 3 is described. The pattern 3 will be used when the picture coding type is P type, and the generated encode data amount as the result of the encoding exceeds α2, and this pattern is a pattern for replacing the encoded data of P picture type under processing with the data leading to the same decoding result as the preceding reference picture if it is decoded. In this pattern 3, the P picture that already has been replaced must not be used as a reference picture in a reference processing of other picture so that the P picture following to the replaced P picture refers to the preceding replaced reference picture. FIG. 8 shows one example. FIG. 8(*a*) is the figure that shows the appearance of the picture data arranged in order of the time series before performing the code replacement processing, and FIG. 6(*b*) is the figure that shows the appearance of the motion picture to be displayed after performing the code replacement processing. The picture sequence is I, B, B, P, P as shown in FIG. 8(*a*), and each picture is represented as a, b, c, d, and e respectively. This pattern 3 corresponds to the case that the generated encode data amount of picture d, which picture type is P, exceeds α2.

Here, the generation processing for replacement pattern signal and the code replacement processing for pattern 3 are described. The same as pattern 1, because the order of the encoding processing is executed in order of I, P, and B, the code replacement processing is performed in order of a, d, e, b, and c. After encoding the picture d, if the code replacement processing is determined to be processed in the code replacement processing determination in the control unit 107 in step 306, the control unit 107 judges the picture type under processing is P and it belongs to pattern 3, and the control unit 107 outputs the replacement pattern signal 1 and specifies the data stored in the replacement pattern storing part 231 for replacement data leading to the same decode result as the preceding reference picture if it is decoded. This replacement pattern 3 specifies the replacing of all pictures to the following reference picture d on the picture sequence with the data leading to the same decode result as the preceding reference picture if it is decoded, and the replaced data is treated as the encoded data. Therefore, the reproduced picture becomes a, a, a, a, e as shown in FIG. 8(*b*) by the code replacement processing in step 308. Here, picture e, which is the following P picture, refers to picture d originally as the preceding reference picture, however, the picture d already has been replaced with the data leading to the same decode result if it is decoded, and substantially the picture a is used as the preceding reference picture in conclusion.

The bit stream for replacement is the data of the forward prediction from the preceding reference picture a performed with the motion vector 0 for all the macro blocks when it is decoded, and the difference between prediction picture and the real picture is "0". In short, it corresponds to the data that the motion vector 217 shown in FIG. 2 is treated as "0", the mode information 205 is treated as an inter mode and forward prediction, and the difference picture 204 is treated as "0", so that the result of the DCT processing turns out to be "0", and the result of the quantization processing turns out to be "0", so the processing in the variable length encoding part 208 corresponds to the case that the encoding processing is performed for "0" data. Therefore, this code depends on neither the input data nor the reference picture at all, and it is possible to prepare it beforehand so that real-time processing can be achieved because the data generation can execute at very high speed. In addition, the decoding result becomes the same picture as the preceding picture a. Only picture a is continuously displayed only in a short time, and the sense of strangeness of appearance can be reduced.

As shown above, 3 types of the replacement pattern and the code replacement processing are described. These can be combined each other and the amount for the generated encoded data can be controlled to be flexible.

When performing the above mentioned code replacement processing, the output bit stream 111 includes replaced picture data, which decoding result becomes similar to that of the near by picture data. In a word, the code replacement processing performs replacement of the picture data with the data leading to the very similar decode results in sequence if it is decoded. In addition, the processed data is controlled so the picture order never reverses in time. Therefore, the motion picture may be seen as if it freezes for a short moment in the vicinity of the replaced picture, however, the displayed blocks are not disturbed much, and the sense of strangeness of appearance can be reduced. In addition, the replacement data are not generated by encoding the source data but prepared beforehand, so that real-time processing can be achieved because the data replacing can be executed at very high speed. Therefore, the sense of strangeness of appearance can be reduced to a minimum and the amount of the generated encoded bit can be surely controlled.

Though in this Embodiment, the code replacement processing is assumed to be processed by picture unit (frame unit when frame based configuration, field unit when field based configuration), however, this invention can be applied to a much larger range or a much smaller range, and the generated encode bit amount can be controlled. However, it is preferable to control the correspondence in the applied portion and unapplied portion, in order to reduce the sense of strangeness.

Moreover, the processing flow shown in FIG. 3 is programmed by using the microcode in the control unit 107, and flexible system design can be achieved.

Moreover, though the above mentioned example of judgement processing whether the code replacement processing is necessary or not is performed based on the amount of the generated encoded bit comparing with the upper limit value as a threshold value in the above mentioned processing flow in step 306 in FIG. 3, the judgment processing whether the code replacement processing is necessary or not is not limited to the above mentioned method for comparing the generated encode bit amount with the upper limit value. For instance, the value considering the quantization step and the mean value of brightness can be set as threshold, and the judgment processing whether the code replacement processing is necessary or not can be determined by comparing the threshold value and the quantization step and the mean value of brightness.

It is understood that the above-mentioned method and the apparatus can be modified in various configurations and the transformations without deviating the concept of the present invention. Therefore, this invention is not limited to the above-mentioned Embodiment.

Effect of the Present Invention

According to the present invention, the upper limit of the generated encode bit amount can be controlled in a real-time processing, and the rate control can be achieved by controlling the generated encode bit amount. The data code replacement processing can be carried out at very high speed and the decoding result of the replaced data becomes similar to that of the vicinity of the picture so that the sense of strangeness of appearance can be reduced. In addition, the quantization step can be reduced without failing the rate control because the data amount can be surely controlled so that the high resolution pictures can be obtained.

According to the present invention, the generated encode bit amount in the encoding processing is controlled by the encoding apparatus side, so that it requires neither a particular configuration nor a particular module in the decoding apparatus side, so every decoding apparatus which corresponds to the standard can decode the data provided by the encoding apparatus of the present invention and can replay motion pictures.

What is claimed is:

1. A variable length encoding apparatus comprising
   a variable length encoding means for encoding an input data into variable length code processing unit by processing unit;
   a buffering means for temporarily storing the variable length encoding data processed by the variable length encoding means; and
   a code replacement processing means for replacing the variable length encoding data stored in the buffering means with a prepared short code, which code amount is less than that of the variable length encoding data according to the generated code amount of the variable length encoding data.

2. The variable length encoding apparatus according to claim 1, further comprising
   a means for setting the upper limit of the generated code amount per one processing unit of the input data,
   wherein the code replacement processing means comprises
   a means for replacing the variable length encoding data stored in the buffering means with the prepared short code when the generated code amount of the processing unit of the variable length encoding data exceeds the upper limit, and
   a means for executing no operation of replacing the encoded data when the generated code amount of the processing unit of the variable length encoding data does not exceed the upper limit.

3. The variable length encoding apparatus according to claim 1, wherein,
   the input data is an intraframe compression data or an interframe compression data of a motion picture, and
   the processing unit is a data per one picture of a motion picture.

4. The variable length encoding apparatus according to claim 1, wherein,
   the prepared short code which the code replacement processing means uses at code replacement processing is data that leads to the same decoding result as the preceding processed replaced data of the processing unit of the code replacement processing by the code replacement processing means when decoding.

5. The variable length encoding apparatus according to claim 4, wherein, the code replacement processing means replaces the input data with the prepared short code input data when the input data is a bidirection prediction encoding picture, and selects the data leading to the same decoding result as either one of an intraframe encoding picture which is preceding nearest at a position in time series, a forward prediction encoding picture which is preceding at a nearest position in time series, an intraframe encoding picture which is following at a nearest position in time series of a forward prediction encoding picture which is following at a nearest position in time series if it is decoded.

6. The variable length encoding apparatus according to claim 5, wherein at the data selection, when the data that corresponds to the following picture is selected, all bidirection prediction encoding pictures between the input data and the selected following picture are replaced with the data leading to the same decoding result as the selected following picture if it is decoded.

7. The variable length encoding apparatus according to claim 4, wherein the code replacement processing means replaces the input data with the prepared short code input data when the input data is a forward prediction encoding picture, and selects the data leading to the same decoding result as either one of an intraframe encoding picture which is preceding at a nearest position in time series, a forward prediction encoding picture which is preceding at a nearest position in time series, or a forward prediction encoding picture following to the forward prediction encoding picture which is the input data refers the selected preceding picture.

* * * * *